United States Patent [19]

McMahon et al.

[11] 4,152,723
[45] May 1, 1979

[54] METHOD OF INSPECTING CIRCUIT BOARDS AND APPARATUS THEREFOR

[75] Inventors: Donald H. McMahon, Carlisle, Mass.; Colin G. Whitney, Woodland Hills, Calif.

[73] Assignee: Sperry Rand Corporation, New York, N.Y.

[21] Appl. No.: 861,753

[22] Filed: Dec. 19, 1977

[51] Int. Cl.² .............................................. H04N 7/18
[52] U.S. Cl. ................................. 358/106; 250/363 S
[58] Field of Search ....................... 358/101, 293, 106; 250/337, 361, 363 R, 363 S, 368, 369, 458, 462, 483, 484

[56] References Cited

U.S. PATENT DOCUMENTS

| | | | |
|---|---|---|---|
| 3,229,033 | 1/1966 | Artet | 358/281 |
| 3,774,030 | 11/1973 | O'Connor et al. | 250/363 |
| 3,813,486 | 5/1974 | Knowles | 358/160 |
| 3,824,402 | 7/1974 | Mullaney et al. | 250/458 |
| 3,835,247 | 9/1974 | Soames | 358/93 |
| 3,835,249 | 9/1974 | Dattilo et al. | 358/293 |
| 3,883,247 | 5/1975 | Adams | 250/484 |
| 3,918,812 | 11/1975 | Holm | 250/459 |
| 3,987,241 | 10/1976 | Lloyd et al. | 358/106 |
| 3,988,530 | 10/1976 | Ikegami et al. | 358/106 |

*Primary Examiner*—Robert L. Griffin
*Assistant Examiner*—Joseph A. Orsino, Jr.
*Attorney, Agent, or Firm*—Howard P. Terry; Eugene L. Flanagan, III

[57] ABSTRACT

A method and apparatus for generating a digital image representation of a printed circuit board. The board has a substrate of insulating material. A pattern of metallic conductors is disposed on a surface of the insulating material. A beam of light energy scans this surface in a predetermined pattern. The beam has an energy level high enough to induce a detectable fluorescence in the surface of the insulating material. This fluorescence is detected and a binary signal is generated to indicate the presence or absence of fluorescence as the beam scans the surface. The binary signal is synchronized with the scanning of the beam such that a binary image representation of the board's surface is provided.

15 Claims, 8 Drawing Figures

METHOD OF INSPECTING CIRCUIT BOARDS AND APPARATUS THEREFOR

BACKGROUND OF THE INVENTION

The present invention relates to automated systems for generating digital representations of printed circuit board patterns.

An automated system for developing a digital image representation of a printed circuit board should be capable of accurately sensing the location and shape of the conductive patterns affixed to a surface of the board's insulating substrate. Such a system should be able to accomplish this task regardless of variations in substrate coloration, and the presence of oxide layers on the conductive patterns. Moreover, the system should be operative to provide an accurate representation of the board's surface despite the fact that etched conductive foils often have irregular surfaces.

SUMMARY OF THE INVENTION

In accordance with the present invention, a method and apparatus is provided for generating a digital image representation of a printed circuit board. A beam of light energy scans, in a predetermined pattern, a surface of the board comprising a pattern of metallic conductors disposed on an insulating substrate. The beam has an energy level high enough to excite a detectable fluorescence in the surface of the insulating substrate. The fluorescence is selectably detected by means sensitive to the wavelength of the fluorescence and is converted to a binary signal which indicates whether the beam is incident on the fluorescing substrate or on the non-fluorescing metallic conductors. The binary signal is then synchronized with the scanning of the beam such that a binary image representation of the board's surface is generated In accordance with a preferred embodiment and method of practicing the present invention, a source generates a short wavelength laser beam having a narrow aperture. The beam is intercepted by a pair of galvanometer mirror deflectors which cause the beam to scan the printed circuit board in line sequential fashion. The scanning of the beam is controlled by the application of two signals applied to the deflectors; one signal controls the deflection of the beam rapidly in a first direction so that it repeatedly scans across the surface of the board, and the other signal controls a less rapid scan of the beam in an orthogonal direction, such that the beam traverses the board sequentially in adjacent line scans. A plurality of photomultiplier tubes are disposed adjacent the scanned surface to detect fluorescence therefrom. The tubes have a filtered aperture such that fluorescent light wavelengths will be transmitted to the tubes for detection, while wavelengths contained in the scanning beam will not be transmitted to the tubes. The tubes provide signals which vary in amplitude with the level of the detected fluorescence. These signals are summed, the sum signal then being converted to a binary signal representative of the board's surface. The binary signal is periodically sampled in synchronism with the scanning of the beam in order to develop a binary image representation of the board's surface.

DESCRIPTION OF THE PREFERRED EMBODIMENTS

Figure 1:
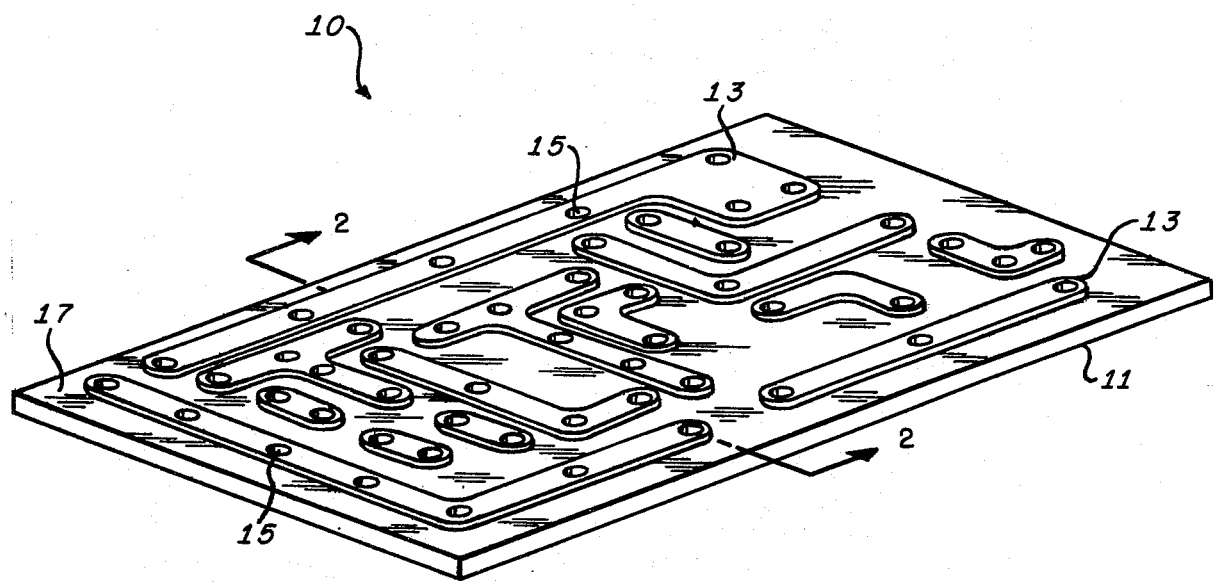
FIG. 1 is a diagramatic view of a printed circuit board.

FIG. 1 illustrates a printed circuit board having a substrate 11 comprised of an insulating material. Typical substrate materials include epoxy glass boards. Affixed to one surface of substrate 11 are metallic conductive patterns 13 to which various circuit components are conductively affixed and thereby electrically connected to other circuit components. Apertures 15 extend through the substrate and metallic patterns to permit conductive leads from the various circuit components normally mounted on the opposing side of substrate 11, to pass through the substrate 11 and metallic conductive patterns 13, to which they are conductively affixed by soldering.

Figure 2:
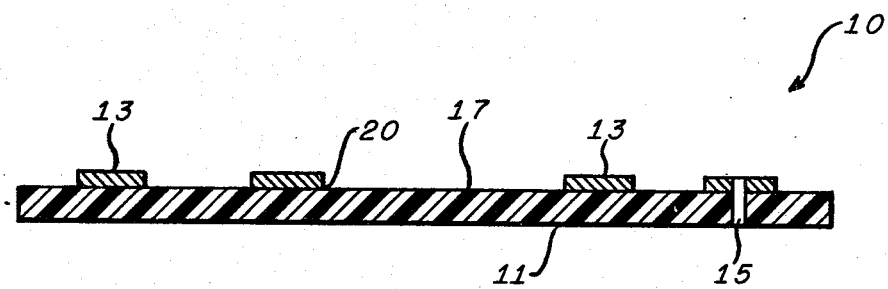
FIG. 2 is a directional view taken along the line 2-2 of FIG. 1.

A sectional view of printed circuit board 10 taken along the line 2—2 in FIG. 1 is illustrated in FIG. 2. The metallic patterns 13 are illustrated in FIG. 2 with an exaggerated thickness.

A typical method for manufacturing printed circuit boards would involve the steps of adhesively affixing a metal foil, such as copper, to one surface of an insulating substrate; coating the exposed surface of the metal foil with a photoresist; exposing the photoresist to a light pattern corresponding to the desired metallic conductive pattern; dissolving away the unexposed portions of the photoresist layer and etching away the exposed surface of the metal foil such that only the desired metallic conductive pattern remains on said surface of the substrate. For a number of reasons, it is difficult to analyze the conductive patterns on the surface of a printed circuit board automatically by means of reflected light beams. The materials used in fabricating the substrate 11 are manufactured in a variety of colors. In addition, the etched metallic patterns have relief, as at 20 in FIG. 2, which can cause undesired and uncontrollable amounts of reflected light.

Figure 3:
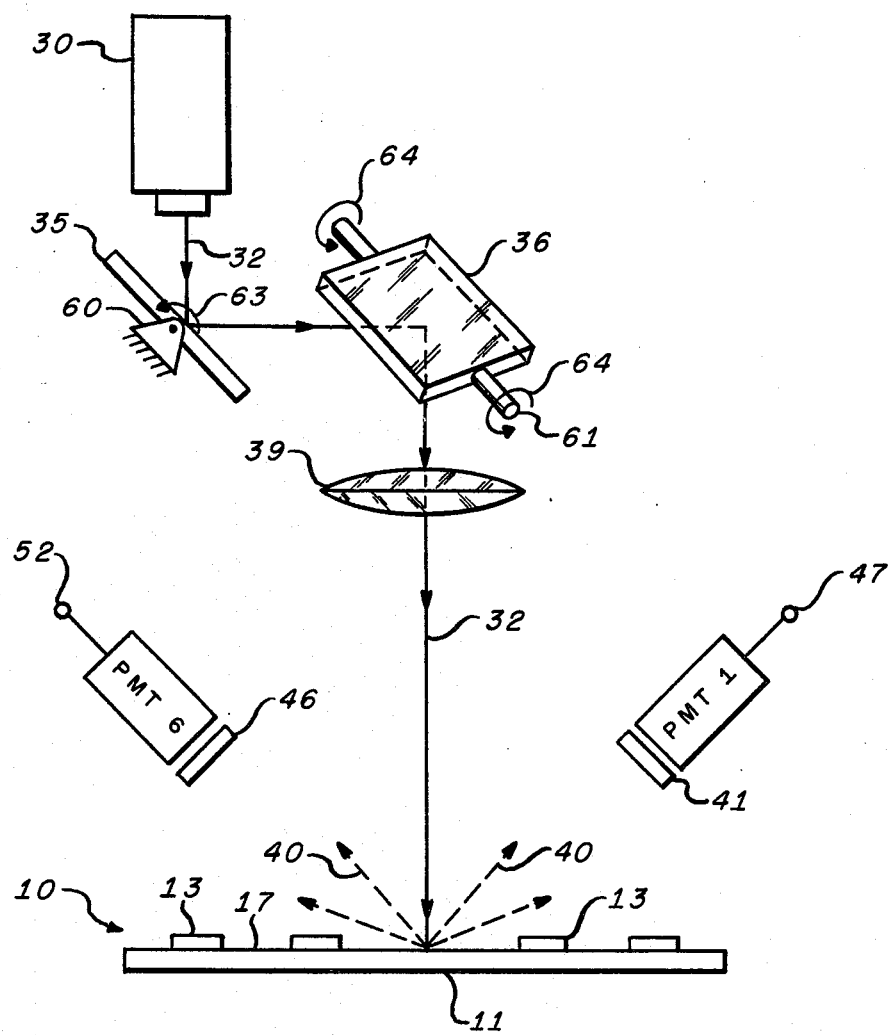
FIG. 3 is a plan view of an apparatus for scanning the surface of a printed circuit board.

A method and apparatus for generating a binary representation of the surface of a printed circuit board is described generally with reference to FIG. 3. Helium-Cadmium laser 30 emits a blue laser beam 32 which is deflected in orthogonal directions by galvanometer mirror deflectors 35 and 36 in order to scan the surface 17 of printed circuit board 10. Flat field lens 39 is disposed in the path of the laser beam 32 between galvanometer mirror deflector 36 and printed circuit board 10. Lens 39 focuses the laser beam 32 in the plane of surface 17 of printed circuit board 10. As laser beam 32 scans over surface 17 it is incident either on the insulating substrate 11 or on metallic conductive patterns 13.

When the beam is incident on the insulating substrate 11, a diffuse fluorescence 40 is emitted from the surface of the insulating substrate. However, when the laser beam 32 is incident on metallic conductive patterns 13, no fluorescent radiation results.

A ring of six equally spaced photomultiplier tubes PMT 1 . . . PMT 6, of which only tubes PMT 1 and PMT 6 are shown in FIG. 3, is disposed above the surface 17 of printed circuit board 10, such that said photomultiplier tubes are spaced equally from surface 17. Each photomultiplier tube PMT 1 . . . PMT 6 has an associated filter 41 . . . 46 which is operative to transmit to its respective photomultiplier tube the fluorescent light wavelengths but not light having the wavelength of laser beam 32. Accordingly, only the fluorescent wavelengths will be transmitted to photomultiplier tubes PMT 1 . . . PMT 6, while any reflected components of laser beam 32 will be excluded therefrom. Each of photomultiplier tubes PMT 1 . . . PMI 6 provides at its respective output terminal 47 . . . 52 an output signal which varies in amplitude with the intensity of the fluorescent light emitted from surface 17 of printed circuit board 10. Each of said output signals, therefore, is indicative of whether laser beam 32 is incident on substrate 11 or on one of metallic conductive patterns 13.

In general, the light beam which scans surface 17 of printed circuit board 10 must be of sufficiently high energy to excite a detectable fluorescence signal in the material comprising substrate 11. In the case of printed circuit boards having epoxy glass substrates, a Helium-Cadmium laser operative to generate a 442 nanometer wavelength beam is an appropriate source. Said Helium-Cadmium laser emits a blue beam which permits the operator to adjust visually the position and focus of the beam on the board's surface. At the same time, the quantum efficiency of the 442 nanometer laser beam is high, resulting in a relatively strong yellow fluorescent emission when the laser beam is incident on the epoxy glass substrate. Other appropriate sources which will excite fluorescence in epoxy glass substrates include 460 nanometer, 488 nanometer and 514 nanometer wavelength argon ion lasers and ultraviolet wavelength mercury arc lamps.

Since the fluorescence emitted by the insulating substrate has a lower intensity level than the scanning beam, appropriate filters 41 . . . 46 are used to selectively transmit only the emitted fluorescent light to photomultiplier tubes PMT 1 . . . PMT 6. Where a 442 nanometer He-Cd laser is utilized to scan a printed circuit board having an epoxy glass substrate, filters 41 . . . 46 should be selected to exclude reflected portions of the laser beam 32 but transmit the yellow wavelength fluorescence excited in the epoxy glass substrate by said beam. Filters sold by the Corning Glass Works Co. under Model Numbers 3-71 and 3-70 are appropriate for this purpose.

As mentioned previously, galvanometer mirror deflectors 35 and 36 are disposed to intercept laser beam 32 and operative to scan said beam in orthogonal directions over surface 17 of board 10. Deflectors 35 and 36 are of conventional construction and operation. As indicated in FIG. 3, deflector 35 is pivoted on a fixed axis 60, as indicated by arrow 63. Affixed to axis 60 is an armature (not shown) positioned in a magnetic field such that the application of a predetermined deflection current to said armature causes deflector 35 to pivot to a determinable angular extent. Deflector 36 is pivotally mounted on axis 61 to which an armature (not shown) is affixed and is operative to rotate deflector 36 on axis 61, as indicated by arrows 64, upon application of a deflecting current to said armature. Deflector 36 operates in the same manner as deflector 35. However, axes 60 and 61 are positioned such that deflectors 35 and 36 are pivotable to deflector laser beam 32 in respective orthogonal directions.

Figure 4:
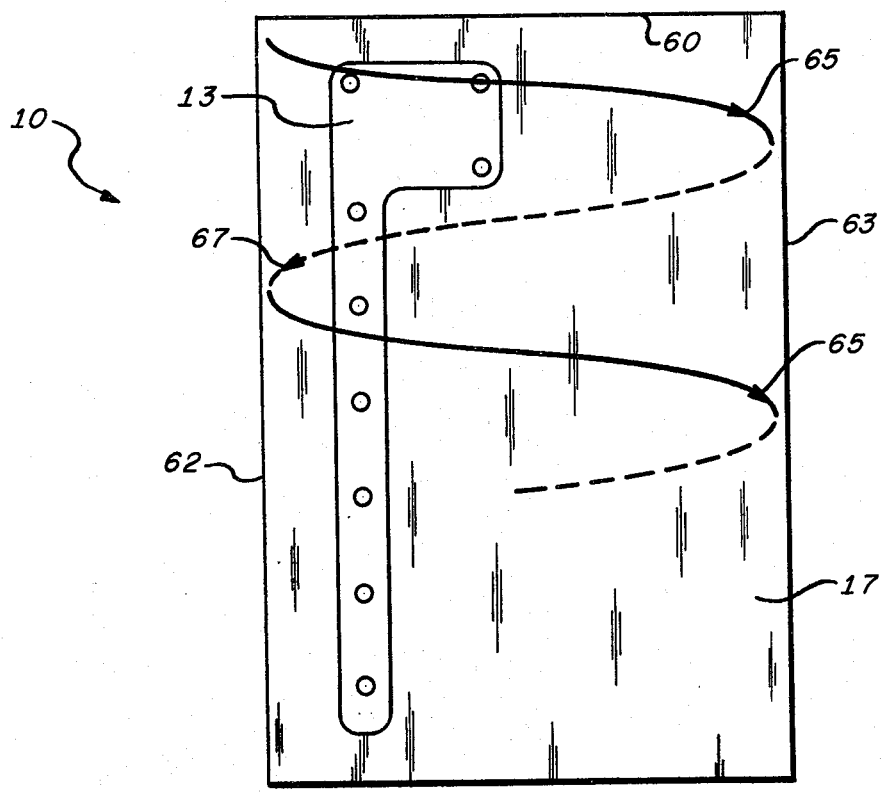
FIG. 4 illustrates a pattern of scanning the surface of a printed circuit board with the apparatus of FIG. 3.

The pattern in which beam 32 scans surface 17 of board 10 is shown in FIG. 4, wherein only one of metallic conductive patterns 13 is shown. Deflector 35 is positioned to deflect beam 32 in a plane perpendicular to surface 17 and parallel to edge 60 of board Deflector 36 is positioned to receive the once-deflected beam 32 and deflect it in a plane perpendicular to surface 17 and parallel to edges 62 and 63 of board 10.

The deflection current applied to the armature affixed to deflector 35 is periodic with a frequency in the order of 10 Hz. Said deflection current is preferably selected such that deflector 35 deflects beam 32 across surface 17 away from edge 62 toward edge 63, as shown by arrows 65, such that the distance x from edge 62 to the point at which beam 32 is incident on surface 17 is defined by the relation $$x = A\left[\frac{\sqrt{2}}{2} + \sin(wt - \frac{\pi}{4})\right]$$

where $\omega$ is equal to the frequency at which beam 32 is deflected across surface 17 by deflector 35 multiplied by a factor of $2\pi$, the value of t being selected as zero when beam 32 begins a scan at edge 62, and where A is a constant determined by the distance from edge 62 to edge 63. At the end of each scan when beam 32 is incident on surface 17 adjacent edge 63, deflector 35 returns beam 32 as indicated by arrow 67, to edge 62 of board 10 in preparation for the next scan. Simultaneously with the successive scanning of beam 32 controlled by deflector 35, deflector 36 is pivoting to deflect beam 32 in a direction parallel to edge 62 and away from edge 60. Deflector 36 pivots much more slowly than deflector 35, such that beam 32 is deflected at a constant linear rate over surface 17 parallel to edge 62.

Figure 5:
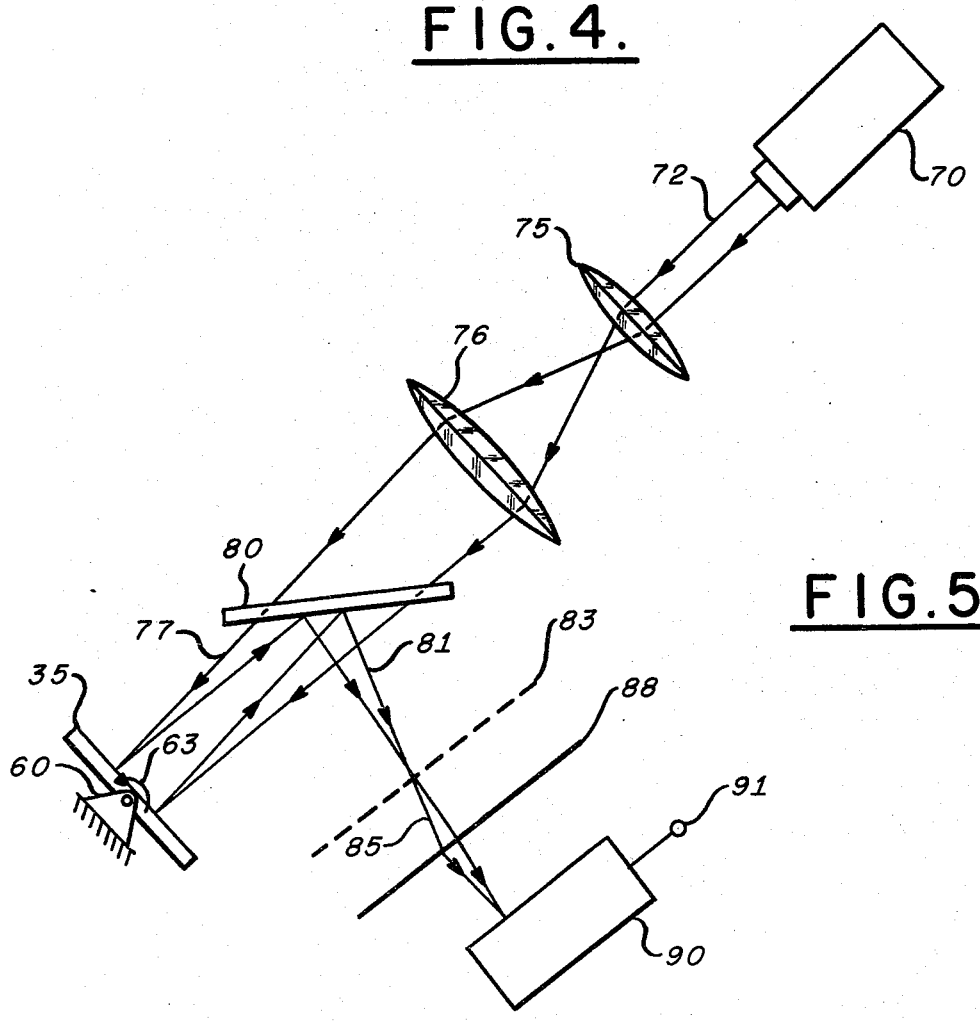
FIG. 5 is a plan view of an apparatus for generating a synchronizing signal.

An apparatus for converting the output signals from photomultiplier tubes PMT 1 . . . PMT 6 into a digital signal representative of surface 17 of board 10 will now be described with reference to FIGS. 5, 6 and 7. FIG. 5 illustrates an apparatus for generating a synchronizing signal indicative of the scanning rate of galvanometer mirror deflector 35. A Helium-Neon laser 70 generates a laser beam 72 and projects said beam through converging lenses 75 and 76 toward the reflective surface of deflector 35. As shown in FIG. 5, a portion 77 of beam 72 is transmitted by beam splitter 80 toward deflector 35, which reflects transmitted portion 77 of beam 72 back toward beam splitter 80. A component 81 of portion 77 is reflected by beam splitter 80 onto Ronchi ruling 83. The surface of Ronchi ruling 83 is characterized by alternating opaque portions and transmissive portions which are regularly spaced. As galvanometer mirror deflector 35 pivots to scan laser beam 32 rapdily over the surface 17 of board 10, as described in connection with FIG. 4, component 81 is deflected back and forth over the surface of ruling 83. The surface of ruling 83 is selected to conform to the field of focus of lenses 75 and 76. Accordingly, a pulsed laser signal 85, having a pulse repetition rate proportional to the rate at which beam 77 and beam 32 are deflected by galvanometer mirror deflector 35, is periodically transmitted through ruling 83 as deflector 35 pivots to scan beam 32 over surface 17 of board 10. Intermittent beam 85 is intercepted by Fresnel collecting lens 88 which focuses beam 85 on photomultiplier tube 90. Consequently, a periodic signal whose frequency varies with the instantaneous rate of scanning by deflector 35 is provided at output terminal 91 of photomultiplier tube 90.

It will be appreciated that the apparatus of FIG. 5 may be modified such that beam splitter 80 is disposed in the path of beam 32 between deflector 35 and deflector 36. Beam splitter 80 thereby separates a portion of beam 32 which is intercepted by Ronchi ruling 83 thus to produce a pulsed laser signal, having a pulse repetition rate proportional to the rate at which beam 32 is deflected by deflector 35. As in the case of the apparatus of FIG. 5, the pulsed laser beam so derived from said portion of beam 32 separated therefrom by beam splitter 80 is intercepted by photomultiplier tube 90 thus to produce a periodic signal at output terminal 91 having a frequency which varies with the instantaneous rate of scanning by deflector 35.

Figure 6:
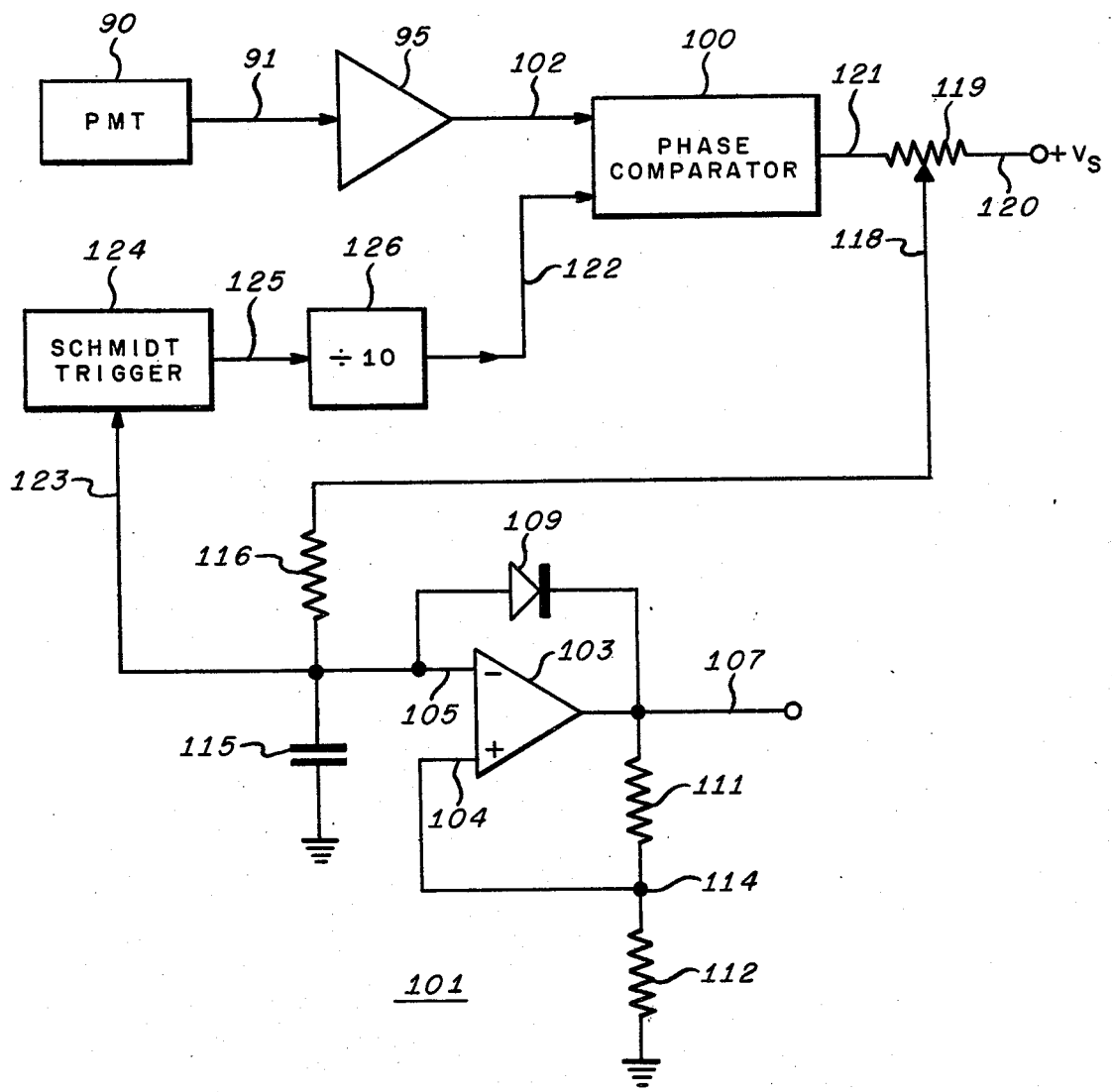
FIG. 6 is a diagram of circuitry for use with the apparatus of FIG. 5 in generating a synchronizing signal.

FIG. 6 illustrates circuitry for generating a clock signal used in synchronizing the binary level signal produced by the fluorescence detecting photomultipler tubes PMT 1 ... PMT 6. Photomultiplier tube 90, as described in connection with FIG. 5, provides a signal at its output terminal 91 which varies in frequency with the rate of scanning. In the described embodiment Ronchi ruling 83 is chosen such that photomultiplier tube 90 produces a signal having a frequency one-tenth that of the frequency at which the output signal from photomultiplier tube 47 is sampled.

Voltage controlled oscillator 101 includes an operational amplifier 103 having a non-inverting input terminal 104, an inverting input terminal 105 and an output terminal 107. Diode 109 has its anode connected to inverting input terminal 105 and its cathode connected to output terminal 107. Resistors 111 and 112 are connected in series between output terminal 107 and ground. Non-inverting input terminal 104 is connected to node 114 at which resistor 111 is connected to resistor 112.

Capacitor 115 is connected between inverting input terminal 105 and ground. Resistor 116 is connected at a first terminal thereof to inverting input 105 and at a second terminal to wiper arm 118 of potentiometer 119. Terminal 120 of potentiometer 119 is connected to a source of supply voltage $+V_s$ and terminal 121 of potentiometer 119 is connected to the output of phase comparator 100.

Inverting input terminal 105 is also connected to input terminal 123 of schmidt trigger 124. The output of schmidt trigger 124 is provided to input terminal 125 of divider 126. Divider 126 is operative to divide the frequency of a square wave signal appearing at its input terminal 125 by a factor of ten and to provide such frequency divided signal at its output terminal which is connected to input terminal 122 of phase comparator 100.

Assuming initially the capacitor 115 is uncharged and that at some point in the time voltage $+V_2$ is applied to terminal 120 of potentiometer 119, capacitor 115 will begin to charge through resistor 116 and potentiometer 119. Initially the voltage at terminal 107 will assume a high positive value. However, as capacitor 115 continues to charge, the voltage at terminal 105 will eventually sufficiently exceed that at terminal 104 to cause the voltage at terminal 107 to switch to a high negative value, thereby causing diode 109 to conduct, whereupon capacitor 115 will discharge through diode 109 toward the negative voltage level of terminal 107. When the voltage at terminal 105 falls below that at terminal 104, the voltage at terminal 107 switches back to said high positive value, thereby forcing diode 109 into a nonconducting state. The charging of capacitor 115 through resistor 116 then recommences. Accordingly, a train of short pulses will be provided at output terminal 107.

It will be appreciated that the voltage across capacitor 115 will assume a waveform having an approximately linear ramp during such times as it is charging, and an abrupt decay when it discharges as the magnitude of the voltage at output terminal 107 abruptly changes to the negative state. The voltage across capacitor 115, therefore, has the same frequency as the signal appearing at output terminal 107. The voltage across capacitor 115 is applied to input terminal 123 of schmidt trigger 124, which provides at its output terminal a square wave signal having the same frequency as the voltage applied to its input terminal. Divider 126 receives the square wave signal from schmidt trigger 124 at input terminal 125 and provides at its output terminal a signal having a frequency which is one-tenth that of said square wave signal. The signal appearing at the output terminal of divider 126 is provided to input terminal 122 of phase comparator 100. At the same time, the periodic signal from photomultiplier tube 90 is amplified in amplifier 95 and provided therefrom to input terminal 102 of phase comparator 100.

It will be appreciated that the frequency of voltage controlled oscillator 101 is a function, inter alia, of the voltage at wiper arm 118 of potentiometer 119, which in turn varies with the magnitude of the output voltage of phase comparator 100. Phase comparator 100 provides an output voltage which varies as the phase difference between the periodic signal produced by photomultiplier tube 90 and the frequency divided signal provided by divider 126, applied to input terminals 102 and 122 respectively, of phase comparator 100. The signal provided at output terminal 121 of phase comparator 100 is thus applied to shift the frequency of the voltage waveform appearing across capacitor 115 such that its frequency is ten times that of the periodic waveform produced by photomultiplier tube 90 and indicative of the rate at which surface 17 of printed circuit board 10 is scanned. The output waveform provided at terminal 107 thus has a frequency which is synchronized with the scanning of the printed circuit board.

Figure 7:
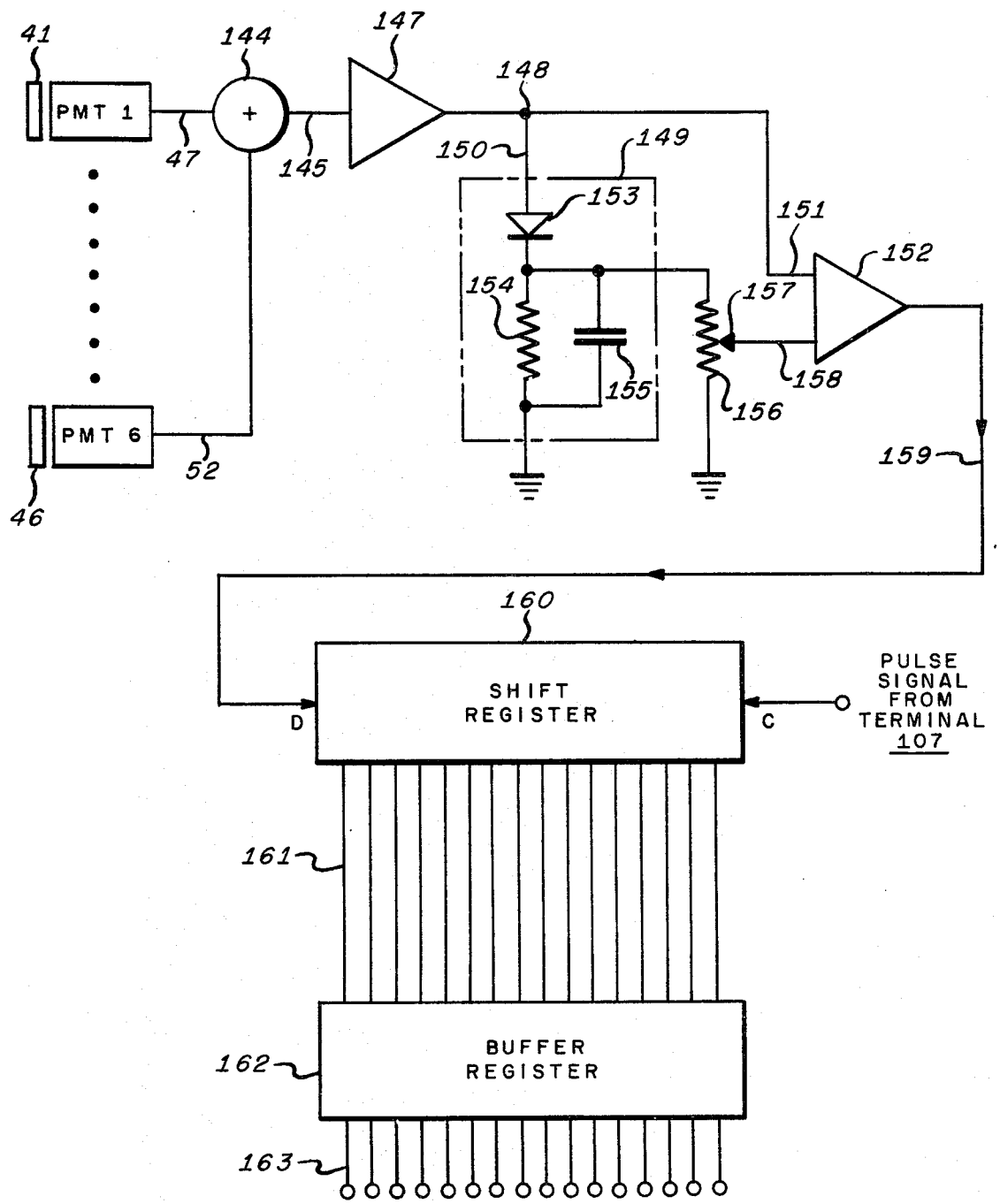
FIG. 7 is a diagram of a circuit for converting fluorescent light emitted from the surface of a printed circuit board to a binary level signal representative of said surface.

FIG. 7 illustrates a circuit for deriving a binary level signal from the fluorescense emitted from the surface of a printed circuit board as said surface is scanned by laser beam 32 of FIG. 3. The output terminals 47 ... 52 of photomultiplier tubes PMT 1 ... PMT 6 are connected to respective input terminals of summing circuit 144 which provides at its output terminals 145 a sum signal proportional to the sum of the signal levels appearing at output terminals 47 ... 52. Since tubes PMT 1 ... PMT 6 are disposed in spaced relation in a ring over surface 17, the sum of the output signals on terminal 47 ... 52, which varies with the intensity of the fluorescence emitted from surface 17 and is, therefore, indicative of the presence or absence of metal at the location on surface 17 of board 10 where beam 32 is instantaneously incident, will not vary as much as a signal at a single one of said terminals 47 ... 52 would vary with the distance from the respective tube PMT 1 . . . PMT 6 to the location on surface 17 where beam 32 is incident.

The summed signal at terminal 145 is amplified by impedence matching amplifier 147, the output terminal of which is connected to node 148. Node 148 is connected both to input terminal 150 of sample and hold circuit 149 and first differential input terminal 151 of differential amplifier 152. Sample and hold circuit 149 comprises diode 153, resistor 154 and capacitor 155. Input terminal 150 is connected to the anode of diode 153. The cathode of diode 153 is connected to a first terminal of resistor 154 and a first terminal capacitor 155. The second terminal of resistor 154 is connected to ground along with the second terminal of capacitor 155. A first fixed terminal of potentiometer 156. is connected to the point at which the cathode of diode 153 is connected to the first terminal of resistor 154 and the first terminal of capacitor 155. A second fixed terminal of poteniometer 156 connected to ground. Wiper arm 157 of potentiometer 156 is connected to second differential input terminal 158 of differential amplifier 152.

In operation as beam 32 scans surface 17 of printed circuit board 10, fluorescence is emitted when beam 32 is incident on the insulating substrate 11, while none is emitted when beam 32 is incident on metallic conductive patterns 13. However, as the beam scans away from the center of surface 17, the level of the emitted fluorescence from substrate 11 decreases. The circuit of FIG. 6 compensates for this change in the fluorescence level by producing a binary level signal indicative of the difference between the instantaneous voltage level of the signal appearing at node 148 and a threshold voltage level which varies with a locally averaged level of the fluorescence emitted by insulating substrate 11 as beam 32 scans across surface 17. This threshold voltage level, which is applied to differential input terminal 151 of differential amplifier 152 is produced by sample and hold circuit 149. The time constant of circuit 149 is selected such that the voltage across capacitor 155 varies in response to an average level of fluorescence emitted by substrate 11. Potentiometer 156 permits the adjustment of the threshold voltage level at differential input terminal 159.

Differential amplifier 152 is operated to produce a binary level signal at its output terminal 159 indicative of whether beam 32 is incident on substrate 11 or on metallic conductive patterns 13. This binary level signal is provided to data input terminal D of sixteen bit shift register 160. At the same time, the pulse signal at output terminal 107 of voltage controlled oscillator 105 of FIG. 6 is provided to clock input terminal C of shift register 160. Accordingly, as each pulse is applied to terminal C, the binary level of the signal applied to input terminal D is stored in shift register 160 in serial form and previously stored information is shifted one bit. The binary information stored in shift register 160 is provided in parallel format at output terminals 161. Buffer register 162 receives the binary information provided at terminals 161 every sixteen clock cycles and stores it until completely new information is provided by shift register 160 sixteen clock cycles hence. The binary level information stored in buffer register 162 is provided at its output terminals 163 in parallel data format. Accordingly, each bit provided at a respective one of output terminals 163 is indicative of the presence or absence of metal at a determinable location on the surface of the printed circuit board being scanned.

Figure 8:
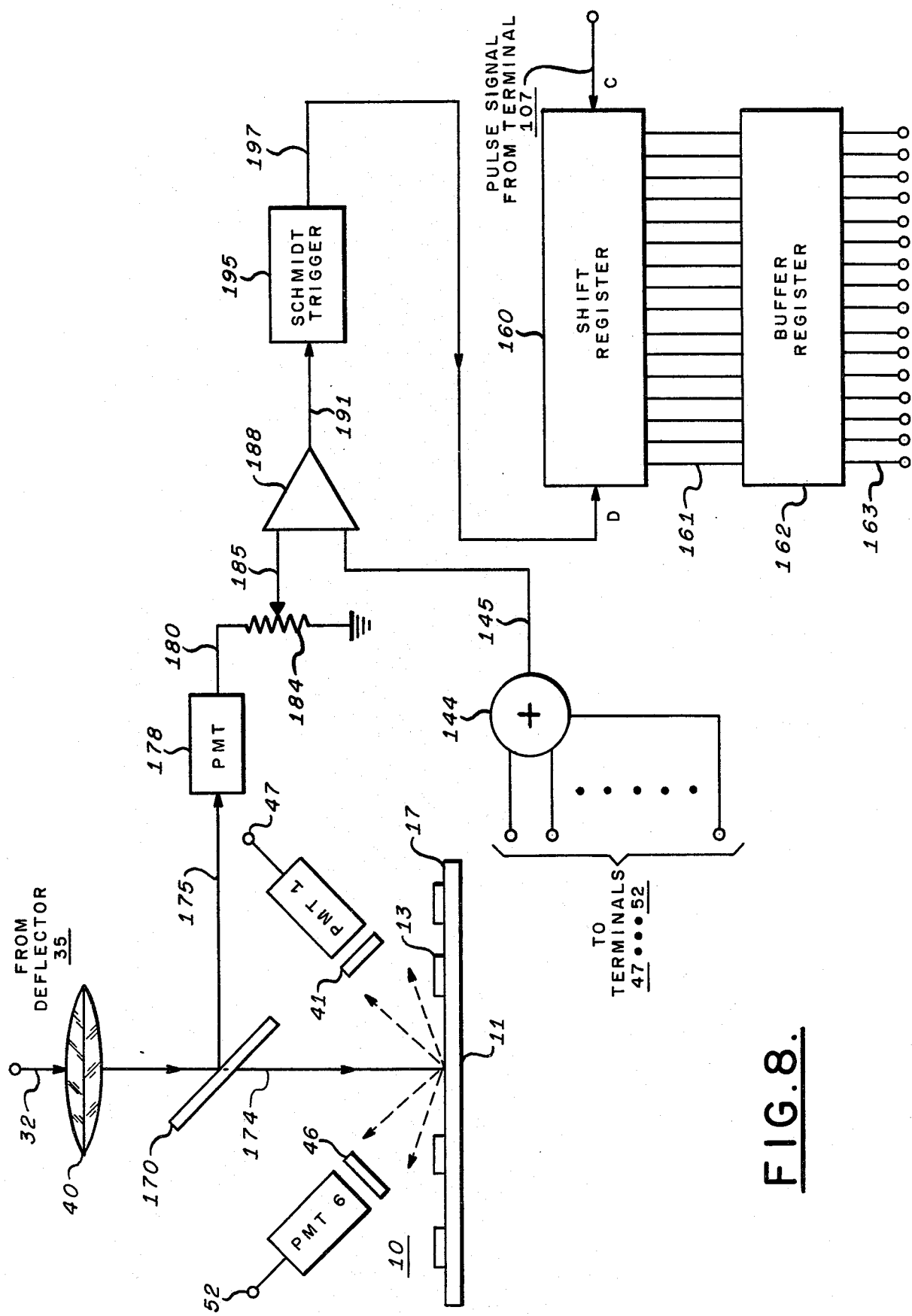
FIG. 8 illustrates a further embodiment of an apparatus and associated circuitry for deriving a binary level signal representative of said surface.

FIG. 8 illustrates a modified apparatus for deriving a binary level signal representative of the surface of a printed circuit board. Elements corresponding to those of FIGS. 3 and 7 are designated by the same reference numerals in FIG. 8. As shown in FIG. 8, a beam splitter 170 is disposed between flat field lens 40 and the printed circuit board 10 which is to be scanned, thus to intercept laser beam 32 after it has been focused by flat field lens 40 and divide beam 32 into a scanning component 174, constituting about 90% of the energy of beam 32 and continuing to propagate toward printed circuit board 10 thus to scan its surface 17, and a laser beam intensity component 175, constituting approximately the remainder of beam 32 and impinging on photomultiplier tube 178. Accordingly, tube 178 will provide at its output terminal 80 a signal varying in amplitude in proportion to the intensity of beam 32.

In FIG. 8 output terminal 180 of photomultiplier tube 178 is connected to a first fixed terminal of potentiometer 184, a second fixed terminal of which is grounded. Wiper arm 185 of potentiometer 184 is connected to a first differential input terminal of differential amplifier 188. Accordingly, when component 175 of laser beam 32 impinges on photomultiplier tube 180, there will be provided at said first differential input terminal of differential amplifier 188, a signal in amplitude proportional to the intensity of beam 32 and adjustable through a range of attenuated amplitude levels by potentiometer 184. A second differential input terminal of differential amplifier 188 is connected to output terminal 145 of summing circuit 144 and is thereby provided with said signal proportional to the sum of the signal levels appearing at output terminals 47 . . . 52 of photomultiplier tubes PMT 1 . . . PMT 6, as described in connection with FIG. 7.

In operation, differential amplifier 188 will provide at its output terminal 191 a signal having a polarity dependent on the relative values of the signals provided at its respective first and second differential input terminals; that is, if the signal level provided to said first differential input terminal of amplifier 188, which is proportional to the intensity of laser beam 32, exceeds the signal level provided to said second differential input terminal of amplifier 188, which varies with the intensity of the fluorescence emitted from surface 17 as component 174 of laser beam 32 scans thereover, an output signal having a first polarity will be provided at terminal 191 of amplifier 188. However, if the signal level provided to said second differential input terminal of amplifier 188, varying with the intensity of said emitted fluorescence, exceeds the signal level provided to said first differential input terminal of amplifier 188, the output signal provided at terminal 191 will assume a value having a second polarity opposite to said first polarity of said output signal. Output terminal 191 of differential amplifier 188 is connected to an input terminal of Schmidt trigger 195. Schmidt trigger 195 thus receives the output signal from differential amplifier 188 and produces therefrom a binary level signal which assumes a first state when the output signal provided to terminal 191 is of said first polarity and a second state when said output signal provided to terminal 191 is of said second polarity. Output terminal 197 of Schmidt trigger 195 is connected to data input terminal D of shift register 160, such that said binary signal produced by Schmidt trigger 195 is provided thereto. As in the case of FIG. 7, the pulse signal at output terminal 107 of voltage controlled oscillator 105 of FIG. 6 is provided to clock input terminal C of shift register 160, such that, as each pulse is applied thereto, the level of the binary signal provided to terminal D from output terminal 197 of Schmidt trigger 195 is stored in shift register 160 in serial form. The operation of shift register 160 and buffer register 162 in the case of the modified apparatus of FIG. 8 is the same as described in connection with FIG. 7.

It will be appreciated that the intensity of the fluorescence emitted from surface 17 of printed circuit board 10 is linearly proportional to the intensity of component 174 of laser beam 32. Since component 175 of laser beam 32 has an intensity proportional to that of component 174 of laser beam 32, variations in the intensity of component 174, which can occur through aging of laser 30, mechanical misadjustment of deflectors 35 and 36, etc., and which will vary the intensity of the fluorescence emitted by substrate 11 when component 174 of beam 32 is incident thereon, are compensated for automatically by the apparatus of FIG. 8. Accordingly, wiper arm 185 of potentiometer 184 is adjusted such that the level of the signal provided to said first differential input terminal of amplifier 188 is set at a value intermediate the two values assumed by the signal provided to said second differential input terminal of amplifier 188 from summing circuit 144 when component 174 is incident on substrate 11 or on metallic conductive patterns 13, respectively. Therefore, the signal provided to the first differential input terminal of amplifier 188 acts as a threshold level which varies automatically with variations in the fluorescence emitted from substrate 11 such that the polarity of the output signal provided by amplifier 188 at output terminal 191 accurately reflects whether component 174 is incident on the substrate 11 or the metallic conductive patterns 13 of board 10 despite variations in the intensity of component 174.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. An apparatus for generating a digital image representation of a printed circuit board having a substrate of insulating material and a pattern of metallic conductors disposed on a surface of said insulating material, comprising:
   means for generating a beam of light energy having an energy level high enough to excite detectable fluorescence in said insulating material;
   means for scanning said surface with said beam in a predetermined pattern;
   means for detecting fluorescence in said surface and for generating a binary signal indicative of the presence or absence of fluorescence in said surface, comprising:
   means for producing a first signal varying in amplitude with the level of said fluorescence;
   means for producing a second signal varying in amplitude with said beam of light energy; and
   means provided with said first signal and with said second signal for producing a binary signal having a first state when said said first signal exceeds said second signal and a second state when said second signal exceeds said first signal; and
   means for synchronizing said binary signal with the scanning of said beam such that a digital image representation of said surface of said board is generated.

2. An apparatus in accordance with claim 1, wherein said means for generating said beam comprises laser beam generating means.

3. An apparatus in accordance with claim 2, wherein said light beam generating means comprises a helium-cadmium laser operative to emit a visible blue laser beam.

4. An apparatus in accordance with claim 2, wherein said light beam generating means comprises an argon ion laser.

5. An apparatus in accordance with claim 1, wherein said scanning means comprises
   deflector means positioned to receive said beam and operative to deflect said beam rapidly in a first direction over the surface of said board; and
   means for effecting relative scanning motion between said beam and said board in a second direction orthogonal to said first direction such that the scanning of said beam in said second direction is less rapid than the scanning of said beam in said first direction.

6. An apparatus in accordance with claim 5, wherein said scanning means further comprises flat field lens means positioned to receive said deflected beam and operative to focus said deflected beam at the surface of said board.

7. An apparatus in accordance with claim 5, wherein said synchronizing means comprises
   means for projecting a second light beam onto said deflector means such that a component of said second light beam is deflected thereby;
   means positioned to receive said component of said second light beam and operative to periodically interrupt said component of said second beam at a rate proportional to the rate at which said component is deflected by said deflector means to produce a pulsed light signal therefrom;
   means positioned to receive said pulsed light signal and operative to produce a pulse signal having a frequency proportional to the rate at which said component of said second beam is interrupted; and
   means coupled with said pulse signal producing means to receive said pulse signal therefrom for sampling said binary signal in synchronism with said pulse signal.

8. An apparatus in accordance with claim 5, wherein said synchronizing means comprises:
   means disposed to receive said beam deflected in said first direction and operative to separate therefrom a portion of said beam;
   means positioned to receive said separated portion of said beam and operative to periodically interrupt said separated portion at a rate proportional to the rate at which said beam is deflected by said deflector means to produce an interrupted beam therefrom;
   means positioned to receive said interrupted beam and operative to produce a pulse signal having a frequency proportional to the rate at which said separated portion of said beam is interrupted; and
   means coupled with said pulse signal producing means for sampling said binary signal in synchronism with said pulse signal.

9. An apparatus in accordance with claim 1, wherein said means for detecting fluorescence in said surface comprises
- photomultiplier tube means responsive to said fluorescence to produce a signal varying in amplitude with the intensity of said fluorescence; and
- means receiving said signal from said photomultiplier tube means at an input terminal thereof and operative to produce said binary signal.

10. An apparatus in accordance with claim 9, wherein said photomultiplier tube means comprises
- a plurality of photomultiplier tubes disposed in spaced relation from each other and spaced equally from said surface, each of said tubes being operative to produce a signal varying in amplitude with the intensity of said fluorescense; and
- summing means having a plurality of input terminals, each of said input terminals being coupled to a respective one of said photomultiplier tubes to receive said signal produced by said one of said photomultiplier tubes, said summing means being operative to produce at an output terminal thereof a sum signal proportional to the sum of said signals produced by said photomultiplier tubes, said output terminal of said summing means being coupled to said input terminal of said means for producing said binary signal to provide said sum signal thereto.

11. An apparatus in accordance with claim 9, wherein said binary signal producing means comprises
- means, provided with said signal from said photomultiplier tube means, for producing a threshold signal which varies in amplitude with said signal from said photomultipler tube means when said beam is incident on said substrate such that fluorescence is emitted therefrom; and
- differential amplifier means having a first differential input to which said signal from said photomultiplier tube means is applied and a second differential input to which said threshold signal is applied, and providing said binary signal at an output terminal thereof.

12. An apparatus in accordance with claim 11, wherein said means for producing a threshold signal comprises a sample and hold circuit.

13. A method for generating a digital image representation of a printed circuit board having a substrate of insulating material and a pattern of metallic conductors disposed on a surface of said insulating material, comprising the steps of:
- scanning said surface of said printed circuit board with a beam of light energy having an energy level high enough to excite detectable fluorescence in said insulating material; said beam scanning said surface in a predetermined pattern;
- producing a binary signal indicative of the presence or absence of fluorescence in said surface comprising the steps of:
- producing a first signal which varies in amplitude with the level of said fluorescence;
- producing a second signal which varies in amplitude with said beam of light energy; and
- producing said binary signal having a first state when said first signal exceeds said second signal and a second state when said second signal exceeds said first signal; and
- synchronizing the binary signal with the scanning of said beam such that a binary image representation of said surface of said printed circuit board is generated.

14. The method of claim 13, wherein said step of generating said binary signal comprises the steps of:
- producing a signal which varies in amplitude with the level of said fluorescence;
- producing a threshold signal from said signal which varies in amplitude with said fluorescence emitted at such times that said beam is incident on said substrate; and
- producing said binary signal by comparing the level of said threshold signal with that of signal which varies with the level of said fluorescence as said beam scans over said surface.

15. The method of claim 13, wherein said step of synchronizing said binary signal comprises the steps of
- producing a pulsating beam of light having a pulse rate proportional to the rate at which said beam scans said board;
- producing a synchronizing signal having a frequency proportional to the pulse rate of said pulsating beam; and
- sampling said binary signal at a rate determined by said synchronizing signal, whereby a digital image representation of said surface is generated.

* * * * *